United States Patent
Dykstra et al.

(10) Patent No.: US 6,624,081 B2
(45) Date of Patent: *Sep. 23, 2003

(54) ENHANCED ETCHING/SMOOTHING OF DIELECTRIC SURFACES

(75) Inventors: Jerald P. Dykstra, Austin, TX (US); David J. Mount, Sr., North Andover, MA (US); Wesley J. Skinner, Andover, MA (US); Allen R. Kirkpatrick, Lexington, MA (US)

(73) Assignee: Epion Corporation, Billerica, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/969,559

(22) Filed: Oct. 2, 2001

(65) Prior Publication Data

US 2002/0016079 A1 Feb. 7, 2002

Related U.S. Application Data (62) Division of application No. 09/461,148, filed on Dec. 14, 1999.

(51) Int. Cl.$^7$ .............................................. H01L 21/20
(52) U.S. Cl. ............. 438/710; 156/345.1; 118/723 CB; 315/111.81
(58) Field of Search ................ 156/345.1; 118/723 CB; 315/111.81; 438/710

(56) References Cited

U.S. PATENT DOCUMENTS

| | | | | |
|---|---|---|---|---|
| 4,381,453 A | * | 4/1983 | Cuomo et al. | 250/398 |
| 4,700,077 A | * | 10/1987 | Dykstra et al. | 250/492.2 |
| 4,786,814 A | * | 11/1988 | Kolondra et al. | 250/592.2 |
| 4,929,840 A | * | 5/1990 | Dykstra et al. | 250/492.3 |
| 4,943,728 A | * | 7/1990 | Dykstra et al. | 250/492.3 |
| 5,091,655 A | * | 2/1992 | Dykstra et al. | 250/492.2 |
| 5,814,194 A | * | 9/1998 | Deguchi et al. | 204/192.1 |
| 6,375,790 B1 | * | 4/2002 | Fenner | 156/345 |
| 2001/0033128 A1 | * | 10/2001 | Torti et al. | 313/359.1 |

* cited by examiner

Primary Examiner—Robert Kunemund
(74) Attorney, Agent, or Firm—Perkins Smith & Cohen LLP; Jerry Cohen; Kathryn E. Noll (57) ABSTRACT

A gas cluster ion beam (GCIB) etching process having a system for producing a gas cluster ion beam utilized to controllably etch a substrate. The gas cluster ion beam is initially directed along a preselected longitudinal axis. A portion of the GCIB etching apparatus is operably connected to the beam producing system and contains the substrate to be etched when impacted by said gas cluster ion beam. The portion of the GCIB etching apparatus includes a system for directing the gas cluster ion beam in a direction offset from the preselected longitudinal axis while permitting unwanted ionizing radiation to remain directed along the longitudinal axis. A substrate holder is located within a portion of the GCIB etching apparatus for positioning the substrate in line with the offset gas cluster ion beam during the etching process, and the unwanted ionizing radiation being substantially prevented from impinging upon the substrate during the etching process.

8 Claims, 7 Drawing Sheets

ENHANCED ETCHING/SMOOTHING OF DIELECTRIC SURFACES

CROSS REFERENCE TO RELATED APPLICATIONS

This application is a divisional application of U.S. Ser. No. 09/461,148 filed Dec. 14, 1999 entitled ENHANCED ETCHING/SMOOTHING OF DIELECTRIC SURFACES and priority is claimed thereof.

BACKGROUND OF THE INVENTION

This invention relates generally to the smoothing of dielectric surfaces, and, more particularly to the etching/smoothing of dielectric surfaces wherein it is desirable to avoid exposing such dielectric to the effects of ultraviolet radiation, X-ray radiation and/or ionizing electromagnetic radiation.

As integrated circuit device sizes have been shrunk to create denser, more functional devices, the gate delays of the devices have typically become shorter and the devices have become faster. However, the corresponding shrinking of the integrated circuits' interconnecting metal lines and of the inter-metal dielectric insulators, has resulted in increased signal propagation delays. These increasing interconnection propagation delays have generally resulted from the increased resistance of the thinner metal interconnect lines and the increased capacitance that results from closer spacing of conductors and from the thinner insulating dielectric layers which are necessitated. This situation, which is well known in the integrated circuit development community, poses a barrier to continued successful increases in integrated circuit density, speed, and functionality.

In order to continue shrinking integrated circuit devices while maintaining or improving their speeds, designers of integrated circuit interconnect are finding it necessary to reduce the resistivity of the metals used and to reduce the inter-metal (both interline and interlayer) capacitances. This trend can be noted in the developing shift from the long-standing use of aluminum interconnect metal to the use of lower resistivity copper. It can also be noted in the developing shift from the use of $SiO_2$ as the dielectric material of choice (having dielectric constant, k=3.9) towards the use of dielectric materials having a lower dielectric constants (low-k materials) in the range of 3>k>1. In order for future generations of integrated circuits to meet their performance goals, the materials and methods for routine fabrication of low-k materials for inter-metal dielectric insulation must be developed. One example of an interconnecting structure which is being developed to take advantage of lower resistivity metal conductors and low-k inter-metal dielectric materials is known in the semiconductor industry as "copper dual damascene interconnect."

Because of the critical nature of this problem for the integrated circuit manufacturing community, a very large effort is being expended to identify and develop low-k materials and methods for their incorporation into the product process flow. In addition to low dielectric constant, there are many other requirements for suitable insulating materials. These include low cost, high leakage resistance, mechanical strength, thermal stability, non-corrosiveness, compatible coefficient of expansion, ease of deposition, gap filling ability, appropriate etching characteristics, ability to act as a migration barrier, and numerous other desired characteristics. No material appears to satisfy all requirements, and so the industry is examining tradeoffs between various possible materials.

One class of low-k materials that is of considerable interest is a family of fluorine-containing polymers generally known as parylenes. These materials have been successfully applied for some time in a variety of industries where conformal dielectric coating of complex shapes has been required. At least two parylenes known as parylene-N and parylene-F have been discussed by R. S. List, et. al. in MRS Bulletin, October, 1997, p.61. They show that these parylenes have properties that are considered favorable for use as potential low-k (k<2.5) integrated circuit dielectric materials and methods have been devised (for example those taught in U.S. Pat. No. 5,879,808—Wray, et. al.) for fabricating them into the multi-level structures required separating circuit interconnection layers.

Historically, $SiO_2$ has been used as the primary dielectric material for silicon integrated circuits. A factor in it's longstanding utility has been the ease and precision with which it can be etched into a desired patterns and thickness using wet chemistry etchants such as hydrofluoric acid and the like. As device geometries have become smaller, there has been an increase in the use of dry etching techniques because of their tendency to be able to produce finer patterns. Most modern low-k dielectric materials including parylene have been generally understood to be best etched using dry etching methods such as plasma etching, ion etching, and the like, rather than by wet etching.

A problem exists, however, in that plasma etching and other dry etching processes are known to sometimes leave a degree of damage on and beneath the etched surfaces. Furthermore, conventional dry etching processes (plasma etching, reactive ion etching, conventional ion etching, sputter etching, and ion beam milling) all unavoidably expose the etched surface to electromagnetic radiation including ultraviolet wavelengths—because the substrate to be etched is directly exposed to radiation from the associated plasma.

Fluorine-containing polymers (fluoropolymers) such as parylene can react, upon exposure to ultraviolet of appropriate wavelengths, to liberate fluorine, which though chemically unbound may remain entrapped in the fluoropolymer matrix. Adjacent metal interconnect layers may eventually react with the corrosive free fluorine, resulting in a shortened useful lifetime of the integrated circuit. This creates a potential integrated circuit device reliability problem.

There is a need for a dry etching technique capable of efficiently producing uniformly homogeneous etching over large diameter (200–300 mm or larger) wafers without residual damage and without producing residual free fluorine in order to enable greater success in the application of fluoropolymers (such as parylenes) for use as inter-metal low-k dielectrics in future integrated circuit generations.

The concept of using gas cluster ion beams (GCIB) for dry etching, cleaning, and smoothing of hard materials is known in the art and has been described by Deguchi, et.al in U.S. Pat. No. 5,814,194. Because ionized clusters containing on the order of thousands of gas atoms or molecules may be formed and accelerated to modest energies on the order of a few thousands of electron volts, individual atoms or molecules in the clusters each only have an average energy on the order of a few electron volts. It is known from the teachings of Yamada, U.S. Pat. No. 5,459,326, that such individual atoms are not individually energetic enough to significantly penetrate a surface to cause the residual surface damage typically associated with the other types of dry etching in which individual atoms have energies on the order of hundreds or thousands of electron volts. Nevertheless, the clusters themselves are sufficiently energetic (some thousands of electron volts) to effectively etch, smooth, or clean hard surfaces.

An important consideration in the ion beam processing of surfaces covered by insulating films (as is the case when fluoropolymer films are deposited on semiconductor wafers) is the tendency for the charged beam to induce charging of the surface being processed (etched, in this case). If sufficient charge is permitted to accumulate on the insulating surface without means for dissipation, the dielectric properties of the film may be exceeded and the film can be ruptured or otherwise permanently damaged by the electrical stress. This problem is well known in ion beam processing such as ion implantation, ion milling, and GCIB processing. It is to be expected that means of limiting the surface charging of fluoropolymer films during GCIB etching must be provided if undesirable and harmful charging is to be avoided. When the positive cluster ions strike the insulating film, they may transfer their charge to the film. The collision process also results in the liberation of secondary particles from the surface—surface atoms thus liberated result in the etching of the surface. The liberated secondary particles may be electrons, neutral atoms, or charged atoms. Free electrons are much more mobile than free charged atoms (ions) and are likely to escape. Thus, the main tendency of the release of secondary particles is to increase the positive charging of the surface. Such charging can produce damage to the insulating material and has prevented the successful prior application of ion cluster beam processing to some insulating surfaces.

It is therefore an object of this invention to provide a method for efficiently etching large diameter (200–300 mm or larger) substrates without residual damage due to electrical charging or to deep surface penetration by light ions and without exposing the substrates to ionizing electromagnetic radiation.

SUMMARY OF THE INVENTION

The objects set forth above as well as further and other objects and advantages of the present invention are achieved by the embodiments of the invention described hereinbelow.

This invention provides a dry etching gas cluster ion beam (GCIB) process for, preferably, etching/smoothing fluoropolymer layers and thin films. The process of this invention results in producing a smoother surface, a surface with less subsurface damage, a surface without charging damage to the fluoropolymer, and a surface without free fluorine impurities caused by ultraviolet or X-ray radiation. The invention accomplishes this end by including means within a portion of a GCIB etching apparatus for directing the gas cluster ion beam in a direction offset from a preselected axis while permitting unwanted ionizing radiation (ultraviolet, X-ray and electromagnetic radiation) to remain directed along the preselected axis. The substrate to be etched being positioned in line with the offset gas cluster ion beam. This invention, therefore, facilitates the successful and efficient application of fluoropolymer and other fluorine bearing insulating dielectric materials to the problem of low-k dielectric insulation between conductors in integrated circuit interconnect systems. For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
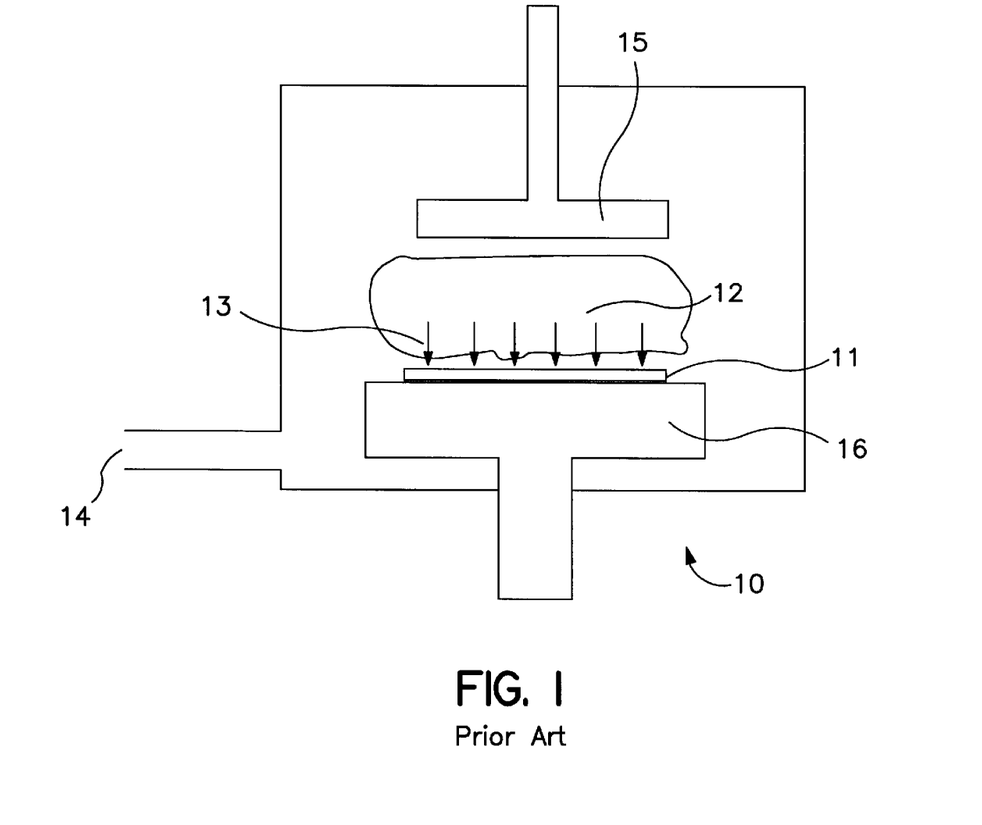
FIG. 1 is a prior art plasma etch or reactive ion etch configuration, showing exposure of the substrate to be etched to ultraviolet radiation generated in the plasma.
Figure 2:
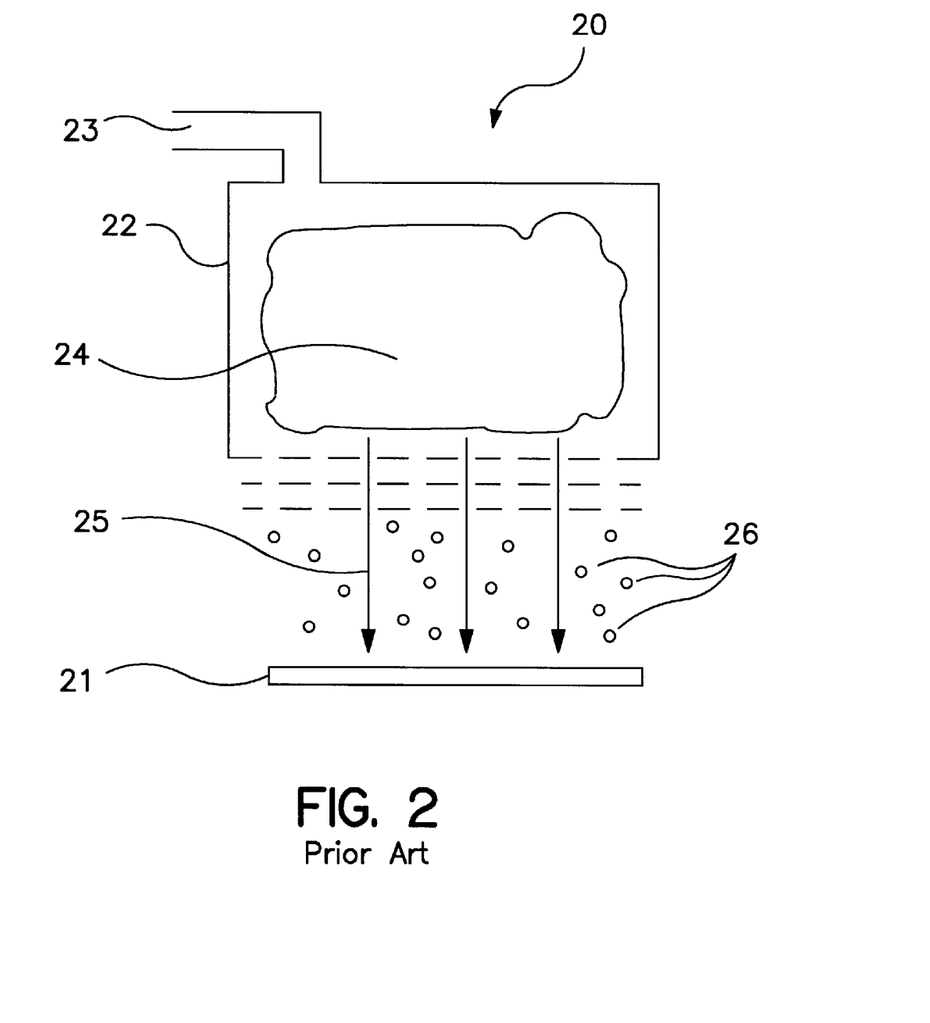
FIG. 2 is a prior art ion milling configuration, showing exposure of the substrate to be etched to ultraviolet radiation generated in the plasma in the ion source.

In order to better understand the present invention it is desirable to describe the prior art systems in which the substrate to be etched (also referred to as smoothed) is directly exposed to the radiation from the associated plasma reference is made to FIGS. 1 and 2 of the drawings. For example, FIG. 1 shows a plasma etch or reactive ion etch system 10 in which the substrate to be etched 11 rests on lower electrode 16. Low pressure gas which may be inert or reactive is introduced through gas port 14. A plasma 12 is generated in the region between upper electrode 15 and lower electrode 16. Through action of the plasma 12, the substrate 11 is etched or reactively etched. Plasma 12 produces radiation including ultraviolet radiation. There is a direct line-of-sight path 13 for the ultraviolet radiation to travel from the plasma 12 to the substrate 11. Although not shown in FIG. 1, plasma etch or reactive ion etch equipment may sometimes use a ultraviolet emitting igniter to trigger plasma formation—in such cases radiation from the igniter may also strike the surface to be etched.

FIG. 2 shows an ion milling system 20 having a Kaufman type or similar ion source 22 into which is introduced a low pressure gas through a gas port 23. A plasma 24 is generated within the source 22 and an ions 26 are formed into a beam directed from source 22 to substrate 21 for etching substrate 21. The plasma 24 produces radiation including ultraviolet radiation. Because there exists a direct line-of-sight path 25 from the plasma 24 to the substrate 21 being etched, ultraviolet radiation from the plasma 24 strikes the substrate 21.

Figure 3:
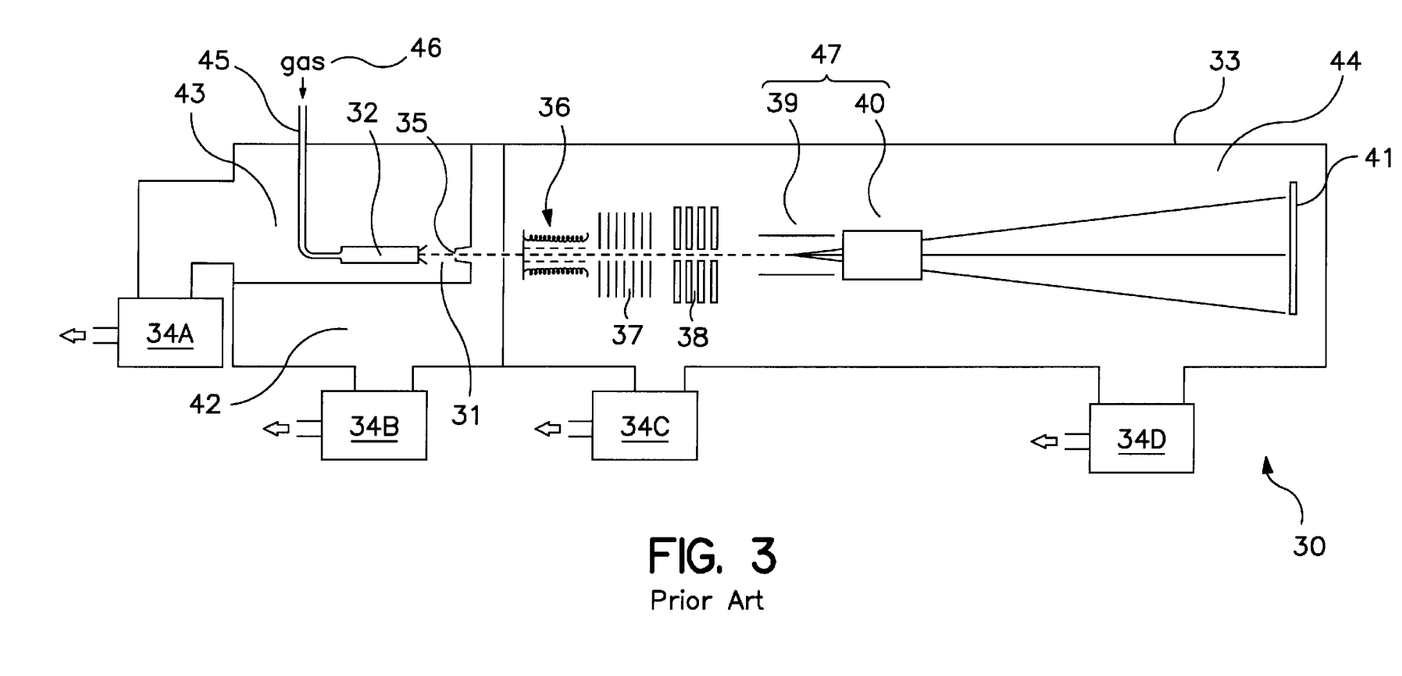
FIG. 3 represents a prior art gas cluster ion beam processing system.

FIG. 3 shows a typical configuration for a gas cluster ion beam processor 30. The processor is enclosed in a vacuum vessel 33 consisting of a source chamber 43 and a processing chamber 44. Although not required, it may sometimes be desirable to also employ a differential vacuum pumping chamber 42 to help isolate the downstream regions from the higher pressure upstream regions. The interior of vacuum vessel 33 is maintained at a vacuum reduced pressure by vacuum pumps 34A, 34B, 34C, and 34D. A source gas 46 is introduced through gas feed tube 45. Gas clusters 31 are formed by creating a supersonic jet of source gas through a properly shaped nozzle 32 into the source chamber 43 which is at a substantially reduced pressure. Cooling resulting from the expansion causes the gas to condense into clusters of from several to several thousand atoms or molecules. A gas skimmer aperture 35 is used to separate the gas products that have not been converted into a cluster jet from the cluster jet so as to minimize pressure in the downstream regions where such higher pressures would be detrimental (e.g., ionizer 36, accelerator high voltage electrodes 38, and processing chamber 44). Suitable source gases 46 are, for example, argon, other inert gases, oxygen, nitrogen, oxygen bearing gases such as carbon dioxide, and nitrogen bearing gases. Inert gases etch the substrate surfaces by mechanical action. Because, during cluster impact, transiently high temperatures and pressures obtain, chemical reactions are facilitated. Therefore, reactive gases like oxygen or oxygen bearing gases are additionally effective because surface chemical reactions can accelerate the mechanical etching effect. Of course, mixtures of inert gases with reactive gases are also possible. Fluoropolymers are hydrocarbons and so will be readily oxidized under cluster impact conditions. Nitrogen is also known to decompose parylene at high temperatures. Oxygen, nitrogen, and oxygen or nitrogen bearing gases are likely to be effective GCIB etchants for fluoropolymers.

After the cluster jet has been formed, the clusters 31 are ionized in an ionizer 36. The ionizer 36 is typically an electron impact ionizer that produces thermoelectrons from one or more incandescent filaments and accelerates and directs the electrons causing them to collide with the gas clusters 31 in the gas cluster jet where it passes through the ionizer 36. The electron impact ejects electrons from the clusters, causing the clusters to become positively ionized. A set of suitably biased high voltage lens electrodes 37 extracts the cluster ions from the ionizer and focuses them to form a gas cluster ion beam. Another set of high voltage accelerator electrodes 38 accelerates the beam to a desired energy, typically from 1 keV to several tens of keV. The accelerated beam is directed at a substrate 41 for GCIB processing. Not shown, but sometimes utilized, is a mass selector for selecting clusters of a certain mass or within a certain range of masses. Such mass selector can be, for example, a weak transverse magnetic field for deflecting monomer ions and other light ions (e.g., those cluster ions of ten or fewer atoms or molecules) out of the beam and passing more massive cluster ions.

Since the fluoropolymer etching application contemplates the etching of large diameter wafers with spatially uniform results, a scanning system 47 is desirable in order to uniformly scan the gas cluster ion beam (GCIB) across large areas to produce spatially homogeneous results. Two pairs of orthogonally oriented electrostatic scan plates 39 and 40 make up scanning system 47, and having suitable beam scanning voltage waveforms imposed can be utilized to produce a raster or other scanning pattern across the desired area.

There are three problems that interfere with the straightforward application of GCIB processing as shown in FIG. 3 to the etching of fluoropolymers. The first problem results from the possible production of a small amount of ultraviolet ionizing radiation in the ionizer region and the potential for that radiation to reach the substrate being processed where it could produce the detrimental effects described in the discussion of the prior art. The ionizer section, as has been mentioned, typically contains incandescent filaments and creates a region populated with accelerated electrons, low energy secondary electrons, and positive ions, both monomers and clusters of all sizes. Neutral gas molecules are also present. It is possible that glow discharges and other plasma effects can take place, potentially producing undesirable ultraviolet (UV) radiation. Furthermore, the filaments for producing the thermoelectrons produce light including a UV component. In the system shown in FIG. 3, there is line-of-sight from the ionizer region to the substrate processing chamber, where the fluoropolymer containing substrate to be etched is disposed. As discussed above, that UV component, even though small, could leave free fluorine in the etched material with the attendant ill effects previously described.

The second problem has to do with the production of low energy ionizing X-radiation (X-rays) in the ionizer, lens, and accelerator regions and the potential for that radiation to reach the substrate being processed where it can produce the same detrimental effects ascribed to UV radiation in the discussion of the prior art, namely the formation of corrosive free fluorine in the fluoropolymer. X-rays are produced by the bremsstrahlung process when electrons are attracted to and strike positively charged electrodes. The presence of electrodes charged at potentials of up to a few tens of kilovolts in the ionizer, lens, and accelerator regions of the GCIB process machine, and the availability of free electron. Free electrons are generated in the ionizer, in the beam by collision of the beam with residual gas in the vacuum, and by secondary electron emission from the vacuum enclosure inner walls when stray ions strike the walls.

The third problem results from the fact that, while etching with GCIB, the bombardment of insulating films such as parylenes by the positively charged ions in a GCIB may induce electrical charging of the insulating surface being etched. As described hereinbefore, such charging can rupture or otherwise damage the insulating film.

The preferred embodiments of the present invention provide a system and technique for substantially eliminating or ameliorating these three problems.

One way of eliminating the undesirable effects of UV on fluoropolymers is to eliminate the UV entirely. Since the ionizer is a potential source of UV in a GCIB process machine, one could eliminate the source of UV by ionizing the beam in a way that did not produce any glow discharge and did not have an incandescent filament. This could be done by ionizing the beam using a radioactive beta source as the source of ionizing electrons.

Alternatively, ionization could be performed by using a laser or other intense light source to photo-ionize the clusters. By directing the laser or light source so as to avoid purposeful transmission of any UV toward the substrate to be etched, the undesirable effects of UV on the substrate to be etched due to the light source can be minimized.

A preferred embodiment of the present invention, however, utilizes a conventional electron impact ionizer that may produce a small amount of UV, but takes advantage of the beam-nature of the GCIB process to eliminate line-of-sight from the potential UV forming region to the substrate processing region. This system of eliminating UV from striking the substrate being etched is preferred because it has the added advantage that it can also prevent X-rays generated in the ionizer, lens, or accelerator regions from reaching the substrate being etched by simultaneously eliminating line-of-sight from the X-ray forming regions to the substrate processing region.

Figure 4:
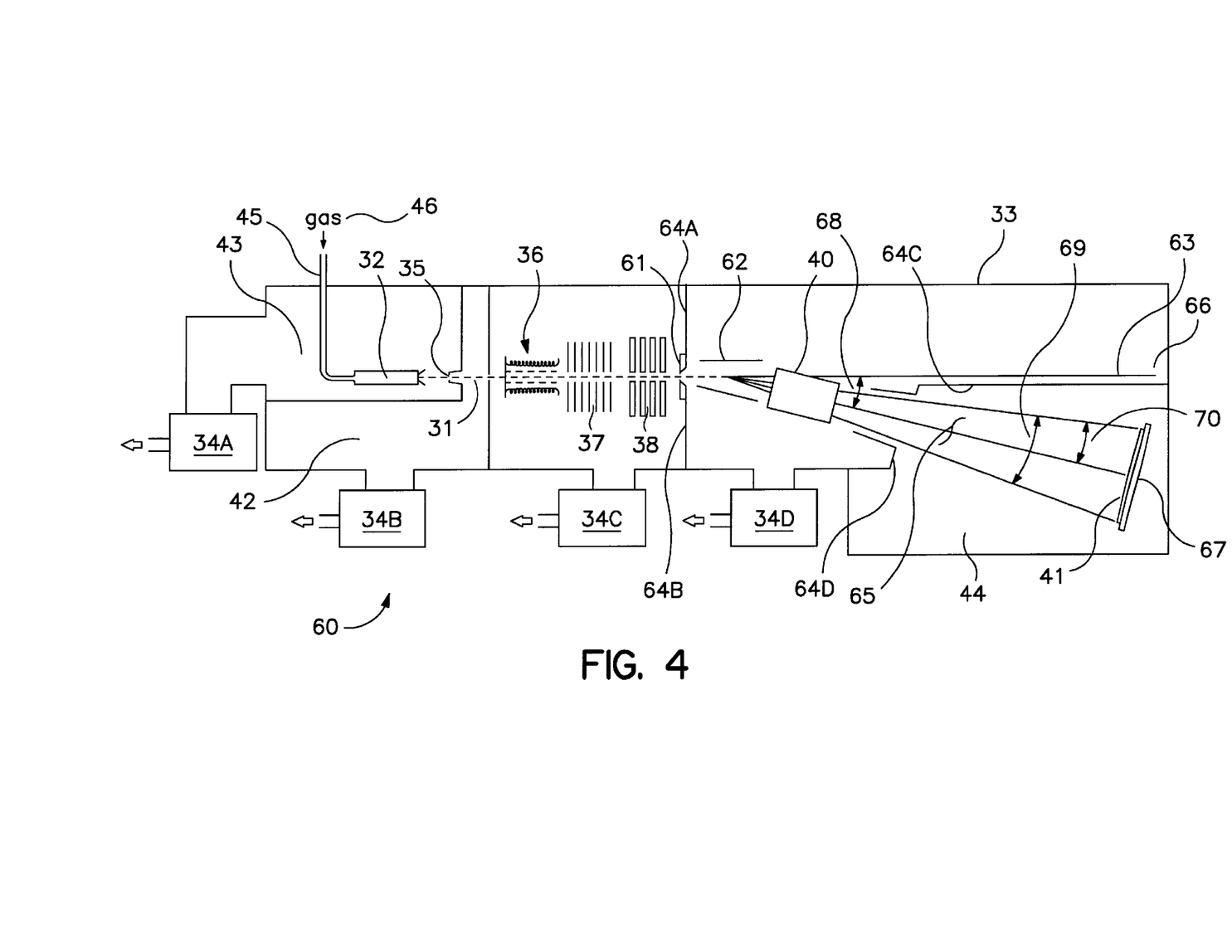
FIG. 4 represents a gas cluster ion beam processing system of the present invention to avoid UV irradiation of the substrate to be etched.

FIG. 4 shows one of several possible embodiments of the invention utilizing of a basic GCIB apparatus configuration that can virtually completely eliminate the possibility of UV or X-rays reaching the substrate 41 to be etched. In this embodiment, a fixed (DC) deflection voltage has been added to the beam scanning voltage waveforms at the Y-scan deflection plates 62 to impose a fixed offset angle 68 between the initial beam path and the path of the scanned GCIB 65, the offset being imposed in the region between the scan plates 62. At scan plates 62, in addition to being deflected in the amount of offset angle 68, the GCIB also is scanned through a scanning angle 69. One half of the scan angle 69 is referred to as the scan half angle 70. The UV radiation and X-rays are not responsive to the electrostatic field between scan plates 62 and continue in a straight line 63 to an impact point 66 in a region now separated from the substrate 41 processing region by the GCIB fixed angular deflection. As shown, collimator 61 and baffle arrangements 64A, 64B, 64C, and 64D can be added in combination with the angular beam offset to further reduce the likelihood of stray reflections directing even a small amount of UV to the substrate 41 processing area. It is especially important that the impact point 66 of the undeflected UV and X-ray radiation be baffled from the substrate 41 processing area, and in the example shown in FIG. 4, baffle 64C serves this purpose. It is also important that the scanned GCIB 65 enter the baffled region and be enclosed in the baffle and thus separated from the straight line path 63. Substrate 41 is held and positioned in the path of the scanned beam 65 and away from the path of the undeflected UV and X-ray radiation by substrate holder 67. If the baffles 64A, 64B, 64C and 64D and the collimator 61 are formed of or have a layer of a material which absorbs X-rays, then they are also effective to prevent X-rays from reaching the substrate 41. The selection of X-ray absorbing materials (such as heavy metals, e.g., lead) and the determination of the necessary thickness of such material (typically a few millimeters in this case) is well known to those who practice the art of X-ray shielding.

FIG. 4 further shows, for purposes of example, but not for limitation, a fixed angular deflection or offset angle 68 of the GCIB of approximately 15 degrees from the initial beam trajectory. However, it is apparent that any deflection angle larger than the scan half-angle 70 is potentially adequate to separate the GCIB from the electromagnetic radiation beam (UV or X-ray), provided that the undesired UV beam can be adequately collimated. Although we have illustrated the case where ionization is by electron impact, it can be appreciated that method and system of this invention can also be used to separate a GICB from stray UV resulting from the use of a photo-ionizing light source.

As shown in FIG. 4, an electrostatic deflection element 62 is used to separate the GCIB from the potential UV beam. Of course, other schemes for deflecting the GCIB from the potential UV beam could also be used. For example, a sector magnet could be used to deflect the beam while allowing the UV and X-rays to pass undeflected. In general we consider an electrostatic form of deflection to be the preferred method for several reasons:

The GCIB will normally contains cluster ions of a range of masses. Although as mentioned earlier, mass selection filters are known, it is not general practice to select only cluster ions of one specific mass or of a very narrow range of masses. To do so would result in the discarding of a large number of cluster ions of the rejected masses resulting in a much lower mass flux, which would result in a reduced etch rate. For this reason, it is advantageous to retain all cluster ions of greater than a predetermined mass. The ionizer typically produces or is typically adjusted to produce a preponderance of cluster ions that are singly ionized—one electron has been removed. All ions are accelerated by falling through an electrostatic potential field of a predetermined voltage, typically some few to few tens of kilovolts. Thus the great majority of gas cluster ions have the same charge (+1) and the same energy (E=Va, where Va is the acceleration potential), but where they have a wide range of velocities due to the fact that they have a continuous range of masses from several to several thousands of atomic or molecular weights. Thus the great majority of the cluster ions have the same electrostatic deflection stiffness, but have widely differing magnetic deflection stiffnesses. A GCIB having a range of cluster sizes responds uniformly to an electrostatic deflection element, but a magnetic deflection element will also tend to disperse the masses, which in general is undesirable.

Readily controllable electrostatic elements can generally be manufactured for a lower cost than similarly controllable magnetic elements.

Power consumption of electrostatic elements is generally lower than that of magnetic elements.

Electrostatic fields are readily contained by the metal containers usually employed as vacuum vessels, while magnetic fields are more difficult to shield and when unshielded can introduce workplace hazards and can interfere with sensitive equipment.

Figure 5:
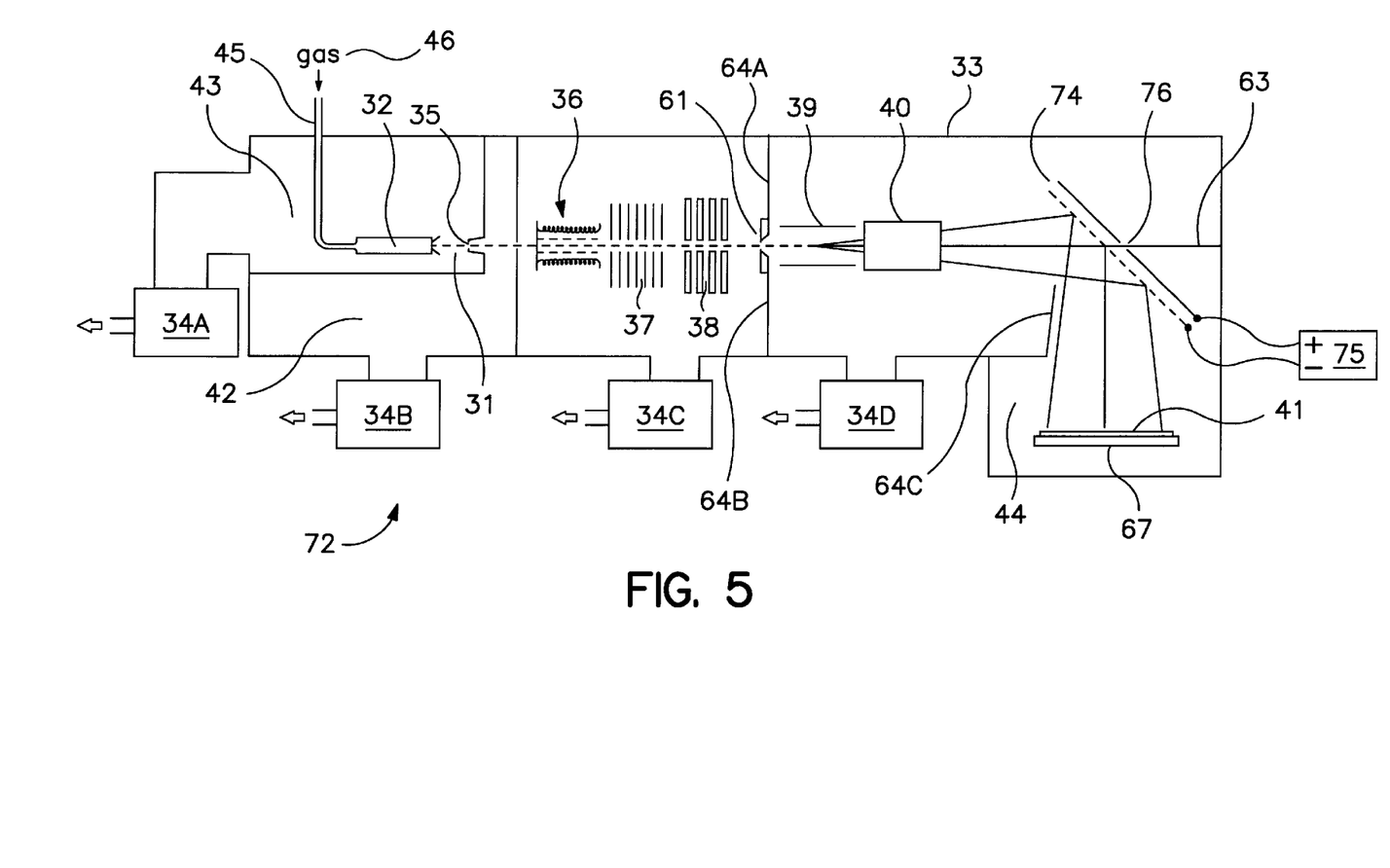
FIG. 5 represents an alternate embodiment of the gas cluster ion beam processing system of the present invention to avoid UV irradiation of the substrate to be etched.

Still referring to FIG. 4, the electrostatic deflection angular deflection function has been shown combined with an electrostatic scanning function in a pair of electrostatic scanning/deflecting plates 62, which replace the simple scanning-only electrostatic scanning plates 39 used in the prior art shown in FIG. 3. This is convenient and efficient. However it is readily appreciated that such configuration is not the only one that can be effective and that there are alternate embodiments of this invention. For example, an alternate embodiment is shown in FIG. 5 which uses an "electrostatic mirror" element 74 to introduce a 90 degree deflection from the initial trajectory of the GCIB, while permitting any potential UV beam 63 to travel undeflected.

The electrostatic mirror element 74 is a plate and grid arranged and electrically biased so as to reflect the GCIB at an approximately 90 degree angle from the path of the beam 63 of ultraviolet or X-ray electromagnetic radiation. The plate has a hole 76 to permit passage of any UV or X-ray beam 63 that may be present. The mirror power supply 75 applies a retarding potential greater than Va, the beam acceleration potential. The grid and the negative side of the mirror power supply are grounded to the wall of the vacuum vessel 33. A potential advantage of this arrangement is that it shortens the overall length of the apparatus. A potential disadvantage is that the grid of the mirror 74 is struck by the GCIB and could experience sputter erosion. It can be appreciated that alternative means of deflecting and baffling so as to separate the GCIB from the possible UV beam and to remove the substrate to be etched from the influence of the UV may also be used within the spirit of the present invention.

Figure 6:
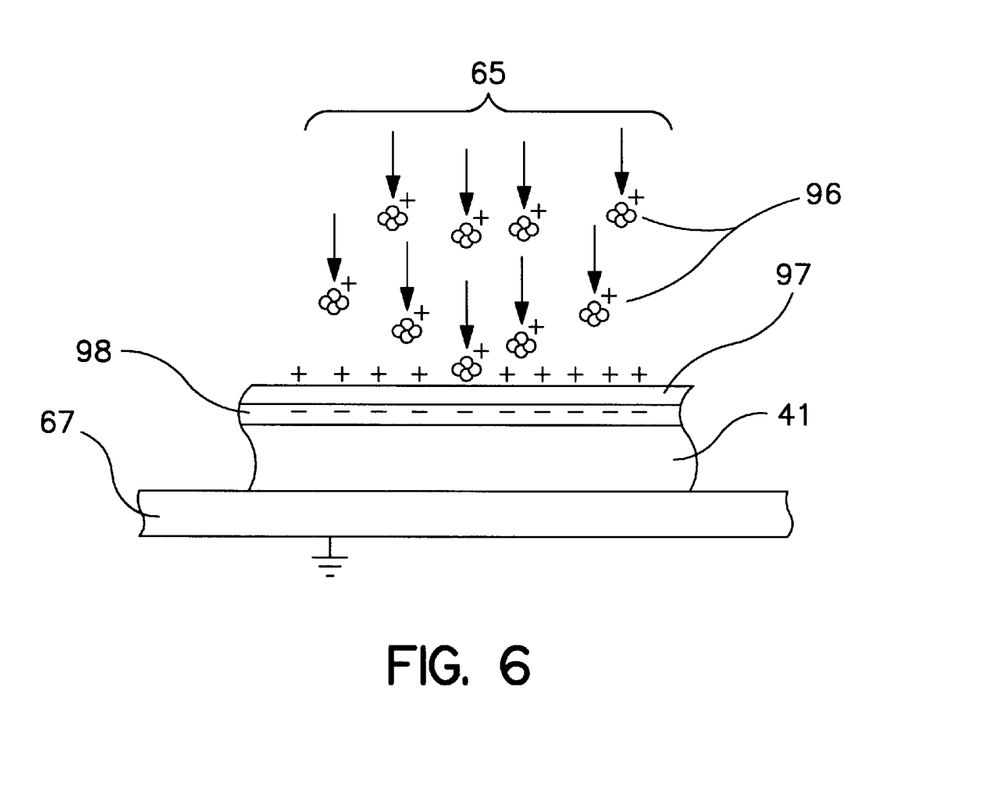
FIG. 6 represents undesirable charging of a dielectric layer occurring during gas cluster ion beam processing.

FIG. 6 schematically illustrates a stage in processing of a semiconductor substrate 41. A fluorocarbon dielectric layer 97 on top of previously processed conductive layer 98 is being smoothed by GCIB processing. The substrate 41 is disposed on a substrate holder 67 that is grounded and, which mechanically supports the substrate 41 during processing. The substrate 41 is grounded by the holder 67. Charge from the bombarding scanned GCIB 65 is transferred to surface of the fluorocarbon dielectric layer 97. Electrons tend to flow from ground through the substrate holder 67, the substrate 41, and the conductive layer 98 on the substrate 41 in order to neutralize the positive charges arriving with the gas cluster ions 96 in the scanned GCIB 65. This induces electrical stress in the fluorocarbon dielectric layer 97. Charge building across the dielectric 97 can stress it and may rupture the dielectric layer and discharge. To be certain of high yield production of semiconductor devices, it is necessary to avoid the dielectric-stressing and electrical discharge problem illustrated in FIG. 6. In order to eliminate the problem of electrical charging of the low-k dielectric films during processing with the positive ion cluster beam, it is necessary to make available a source of available electrons to the dielectric surface so that they may continuously neutralize the surface to prevent accumulation of a harmful charge across the dielectric layer 97.

Figure 7:
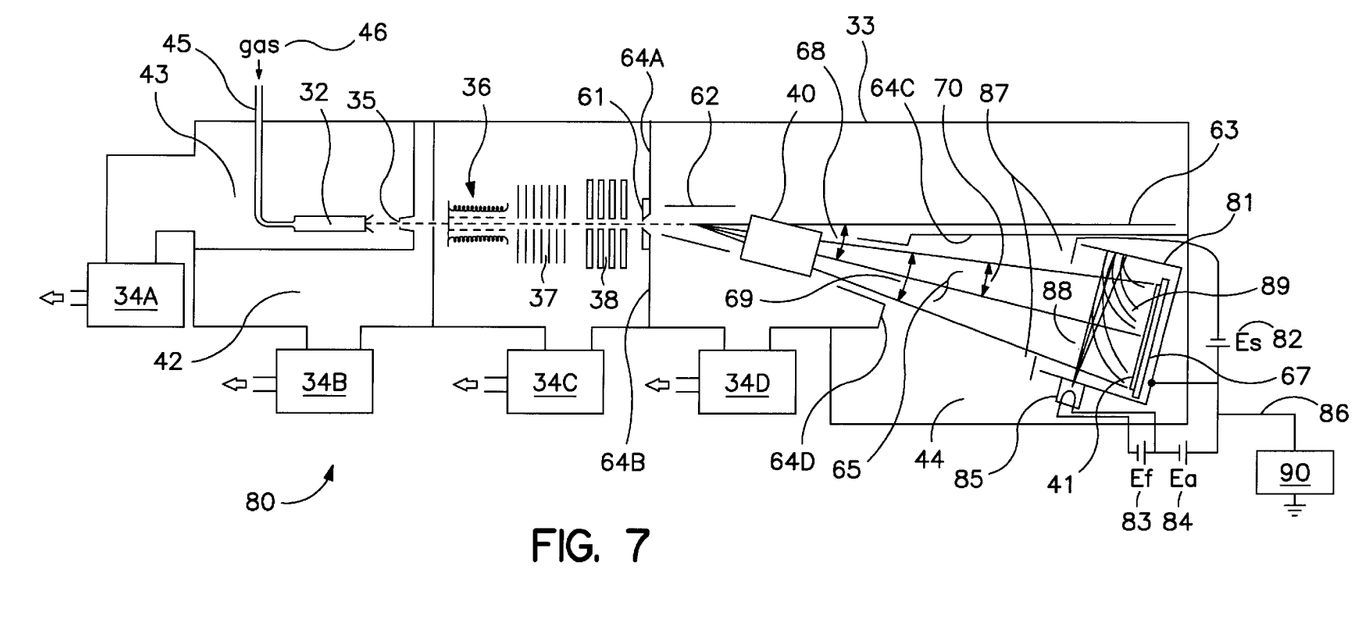
FIG. 7 represents a further preferred embodiment of the gas cluster ion beam processing system of this invention for etching insulating surfaces without damage due to surface charging.

This may be accomplished in any of several ways. A source of thermoelectrons (e.g. a hot filament) may be placed in the vicinity of the substrate to be etched. A source of low energy secondary electrons generated from collision of an accelerated beam of electrons with a surface in the vicinity of the substrate to be etched may be used. A plasma bridge source of low energy electrons may be conveyed to the substrate to be etched by a neutral plasma in the substrate processing area. All of these methods are viable methods of neutralizing any positive charge that would otherwise tend to accumulate on the surface of a fluoropolymer dielectric film being etched by a GCIB method. Without such measures, damage from charging is likely to result in such negative consequences that the otherwise useful and novel process might be severely impaired in usefulness. FIG. 7 shows further embodiment of the GCIB system of this invention similar to that shown in FIG. 4 for UV free etching of fluoropolymer dielectric layers including modifications to minimize the effects of surface charging due to the use of positive cluster ions as the etching means. The substrate processing region is surrounded with a Faraday enclosure 81 having a suppressor ring electrode 87 at the beam entrance opening of the Faraday enclosure 81. The suppressor ring electrode 87 is negatively biased with respect to the Faraday enclosure 81 by suppressor power supply 82 so as to permit entrance of the cluster ions 65 with minimal influence, but yet also prevent the exit of electrons, retaining all secondary electrons in the Faraday enclosure where they may be returned to the substrate 41. Additionally, an active electron gun 85 powered by filament power supply 83 and anode power supply 84 is attached to the side-wall of the Faraday enclosure 81. The gun 85 is configured and biased to project a beam of primary electrons 88 to the opposite wall of the Faraday enclosure 81. The primary electron beam 88 induces the emission of low energy secondary electrons 89 from the Faraday enclosure wall. These low energy electrons 89 may flow to the substrate 41 as required to minimize positive charging due to arrival of the positive cluster ions 65. In some cases it may be desirable to control the amount of etching that occurs by measuring the total amount of positive gas cluster ions that strike the substrate 41. In such a case, a lead 86 from the Faraday enclosure 81 conducts charge to an integrator 90 that integrates the charge to provide an indication of etch process progress.

Although the invention has been described with respect to various embodiments, it should be realized this invention is also capable of a wide variety of further and other embodiments within the spirit and scope of the appended claims.

What is claimed is:

1. A method of etching a dielectric with gas cluster ion beam (GCIB) comprising the steps of:

providing a gas cluster ion beam;

separating the gas cluster ion beam from any unwanted ionizing radiation;

directing the gas cluster ion beam at a substrate to be etched during an etching process; and further protecting the substrate from exposure to the unwanted ionizing radiation during the etching process.

2. A method of etching a dielectric with gas cluster ion beam as defined in claim 1 further comprising the step of:

providing a source of excess electrons during the etching process to prevent undesirable charging of the substrate surface.

3. A method of etching a dielectric with gas cluster ion beam as defined in claim 1 further comprising the step of:

providing baffles around at least a portion of the substrate.

4. A method of etching a dielectric with gas cluster ion beam as defined in claim 1 wherein said unwanted ionizing radiation contains UV radiation.

5. A method of etching a dielectric with gas cluster ion beam as defined in claim 1 wherein said unwanted ionizing radiation contains X-ray radiation.

6. A method of etching a dielectric with gas cluster ion beam as defined in claim 5 further comprising the step of:

providing an X-ray absorbing material to a baffle wherein said baffle is provided around at least a portion of the substrate.

7. A method of etching a dielectric with gas cluster ion beam as defined in claim 1 wherein said unwanted ionizing radiation contains both UV and X-ray radiation.

8. A method of etching a dielectric with gas cluster ion beam as defined in claim 1 wherein said unwanted ionizing radiation is electromagnetic radiation.

* * * * *